United States Patent [19]
Conti et al.

[11] Patent Number: 5,425,810
[45] Date of Patent: Jun. 20, 1995

[54] REMOVABLE GAS INJECTORS FOR USE IN CHEMICAL VAPOR DEPOSITION OF ALUMINIUM OXIDE

[75] Inventors: Richard A. Conti, Mt. Kisco; David E. Kotecki, Hopewell Junction; Donald L. Wilson, New Windsor, all of N.Y.; Justin W. Wong, South Burlington, Vt.; Steven P. Zuhoski, Rowlett, Tex.

[73] Assignee: Internation Business Machines Corporation, Armonk, N.Y.

[21] Appl. No.: 241,254

[22] Filed: May 11, 1994

[51] Int. Cl.6 .................. C23C 16/00; C23C 16/12
[52] U.S. Cl. ........................ 118/715; 222/566
[58] Field of Search ............... 118/715; D23/213; 222/566, 567

[56] References Cited

U.S. PATENT DOCUMENTS

| D. 297,160 | 8/1988 | Robbins | D23/213 |
|---|---|---|---|
| 4,446,815 | 5/1984 | Kalbskopf et al. | 118/718 |
| 4,473,171 | 9/1984 | Nunlist | 220/465 |
| 4,798,165 | 1/1989 | de Boer | 118/715 |
| 4,825,809 | 5/1989 | Mieno | 118/725 |
| 4,926,793 | 5/1990 | Arima | 118/730 |
| 5,050,534 | 9/1991 | Yates | 118/733 |
| 5,067,437 | 11/1991 | Watanabe | 118/715 |
| 5,136,975 | 8/1992 | Bartholomew et al. | 118/715 |
| 5,146,869 | 9/1992 | Bohannon | 118/724 |
| 5,268,034 | 12/1993 | Vukelic | 118/719 |
| 5,273,586 | 12/1993 | Kim | 118/723 E |
| 5,279,670 | 1/1994 | Watanabe | 118/725 |
| 5,320,680 | 6/1994 | Learn | 118/724 |

FOREIGN PATENT DOCUMENTS

| 2294019 | 5/1990 | Japan . |
|---|---|---|
| 5177545 | 7/1993 | Japan . |

*Primary Examiner*—R. Bruce Breneman
*Assistant Examiner*—Jeffrie R. Lund
*Attorney, Agent, or Firm*—Whitham, Curtis Whitham & McGinn; Allison Mortinger

[57] ABSTRACT

A removable gas injector design compatible for use in chemical vapor deposition reactors that allows proper mixing of the reactant gases, reduced cycle time associated with cleaning of gas injector components, and elimination of uncertainties associated with manual cleaning of the injector. A better reliability to the system due to the known condition of the nozzle after a clean is achieved.

6 Claims, 2 Drawing Sheets

REMOVABLE GAS INJECTORS FOR USE IN CHEMICAL VAPOR DEPOSITION OF ALUMINIUM OXIDE

BACKGROUND OF THE INVENTION

1. Field of the Invention

The present invention generally relates to Chemical Vapor Deposition (CVD) of aluminum oxide in the manufacture of semiconductor devices and, more particularly, to a removable gas injector design which can facilitate reduced cycle time associated with cleaning of its components and elimination of uncertainties associated with manual cleaning of the prior injector design that was not removable. The invention has important applications to other processes using a warm-wall CVD reactor such as MOCVD (metal oxide chemical vapor deposition), in which $Al_2O_3$ is a particular example.

2. Description of the Prior Art

In the Chemical Vapor Deposition (CVD) technique, an important element to create and maintain the chemical vapor atmosphere at the wafer source is the gas injector. The injector receives a number of gases and discretely conveys them to the area above the surface of the wafer or substrate where they mix, react, and then form a layer on the wafer or substrate.

In order to insure a proper film or coating, the gases must be introduced substantially uniformly over the surface of the wafer or substrate. If the gases are not uniformly delivered, they do not mix properly, do not have desirable chemical concentrations, and consequently lead to defective deposition of films or coatings on the wafers or substrates. Therefore, it is important to refine the method and apparatus of delivering gaseous chemicals to a wafer or substrate to achieve a uniform deposition of a film or coating.

During the normal operation of an aluminum oxide low pressure CVD (LP CVD) system, the gas mixing injectors are kept at an elevated temperature both by radiation heating from the substrate holder and by the conduction heating from the attached hot wall process chamber. This elevated temperature is nominally in the range of 150°-200° C. and is suspected to be hotter in localized areas. During deposition cycles of the LP CVD aluminum oxide, the reactant gas (Aluminum Triisopropoxide) contacts the injector surfaces and, due to the elevated temperature, some deposits are formed on these surfaces. See, for example, those injector surfaces identified as 'b' in FIG. 3. These deposits can alter the chemistry of gases flowing past them, thus changing the concentrations and species entering the reaction chamber. For example, assume that a delivery tube of stainless steel is heated to 200° C. and Aluminum Triisopropoxide passes through it. As long as the interior surface of the tube remains clean, the Aluminum Triisopropoxide remains pure. However, a thin coating of Aluminum oxide on the interior surface of the stainless steel tube can result in a degradation of gas delivered to include some alcohols. Thus, the channel does not need to be completely sealed to have a negative effect on the film composition and uniformity.

Over a period of time, the deposits can seal off the flow passages in the injector, thus creating a non-uniform flow and mixing pattern. This is manifested by the disruption of film composition, film uniformity, film quality, or a combination of these on the substrate. During subsequent cleaning procedures, especially using in-situ cleaning procedures, there are no means to insure that internal flow passages are cleaned sufficiently to allow unrestricted flow. Moreover, the coatings on the injector can become sources for particulates, and partially cleaned injector passages may become sources for particulate contamination.

In the current system, neither the flow baffle nor the flow injector are removable. Deposits on the baffle plate and the injector cause the following problems: (1) clogging, (2) particulates, and (3) chemistry modification. More specifically, clogging of the injector holes and any small openings in the injector/baffle plate assembly cause a lack of reproducibility from wafer to wafer. The additional buildup of film on the injector and baffle plate components can lead to cracking and flaking of the deposit producing particulates which reduce the yield (i.e., area of good regions) on the substrate surface. Films on the injector and baffle plate can modify the chemistry taking place in the reactor leading to additional film uniformity, film composition, and film quality problems at the substrate and a lack of reproducibility of films from wafer to wafer.

The current procedures are to cool the hot wall process chamber, the source of the delivery system, and shut off the heat to the chuck. Once the system reaches a safe temperature, the flow distribution baffle and the injector are then manually scrubbed with an abrasive material, and efforts are made to clear the hydroxide of Aluminum depositions in the flow passages of the injector and the baffle surface. In the original system, before the injector could be cleaned, the gas delivery system and chamber needed to be purged, at operating temperature, for ninety minutes, and then the heaters would be turned off, allowing the system to reach a safe temperature in about six hours. After the injector was cleaned, it took about eight hours for the system to stabilize at the operating temperature. There was no guarantee that the injector passages had been adequately cleaned due to the complex drilling patterns that cannot be seen visually with a fixed, non-removable injector installed.

SUMMARY OF THE INVENTION

It is therefore an object of the present invention to provide a removable nozzle and baffle plate assembly for a CVD process which allows easy cleaning, the nozzle having a unique hole pattern that distributes the reactants to the mixing region of the gas injector in a uniform manner and facilitates cleaning.

It is another object of the invention to provide a method and apparatus for a CVD process that allows proper mixing of the reactant gases, easy removal and replacement of the gas injector assembly at operation temperature, allowing for cleaning of the removed injector assembly.

According to the invention, the injector is designed to separate into two distinct units. One unit is the injector base and remains attached to the hot process chamber wall. The other unit is a removable nozzle that can be quickly removed and replaced with a clean nozzle. To remove the nozzle, the flow distribution baffle is removed, the two nozzle mounting screws are removed, and the nozzle is simply lifted off. Installation is equally as simple as the nozzle is placed back into position, locator pins insuring correct orientation, the two mounting screws installed, and the flow distribution baffle reattached. The contaminated unit can then be cleaned off line, inspected, and readied for installation when required.

With the removable injector of this invention, the purge can be reduced to ten minutes, and only the chuck needs to be cooled, which takes approximately two hours to reach a safe temperature. Heating up the chuck, after the injector is replaced, takes only about one hour. This results in a significant time savings and increases the up-time of the reactor.

BRIEF DESCRIPTION OF THE DRAWING

The foregoing objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
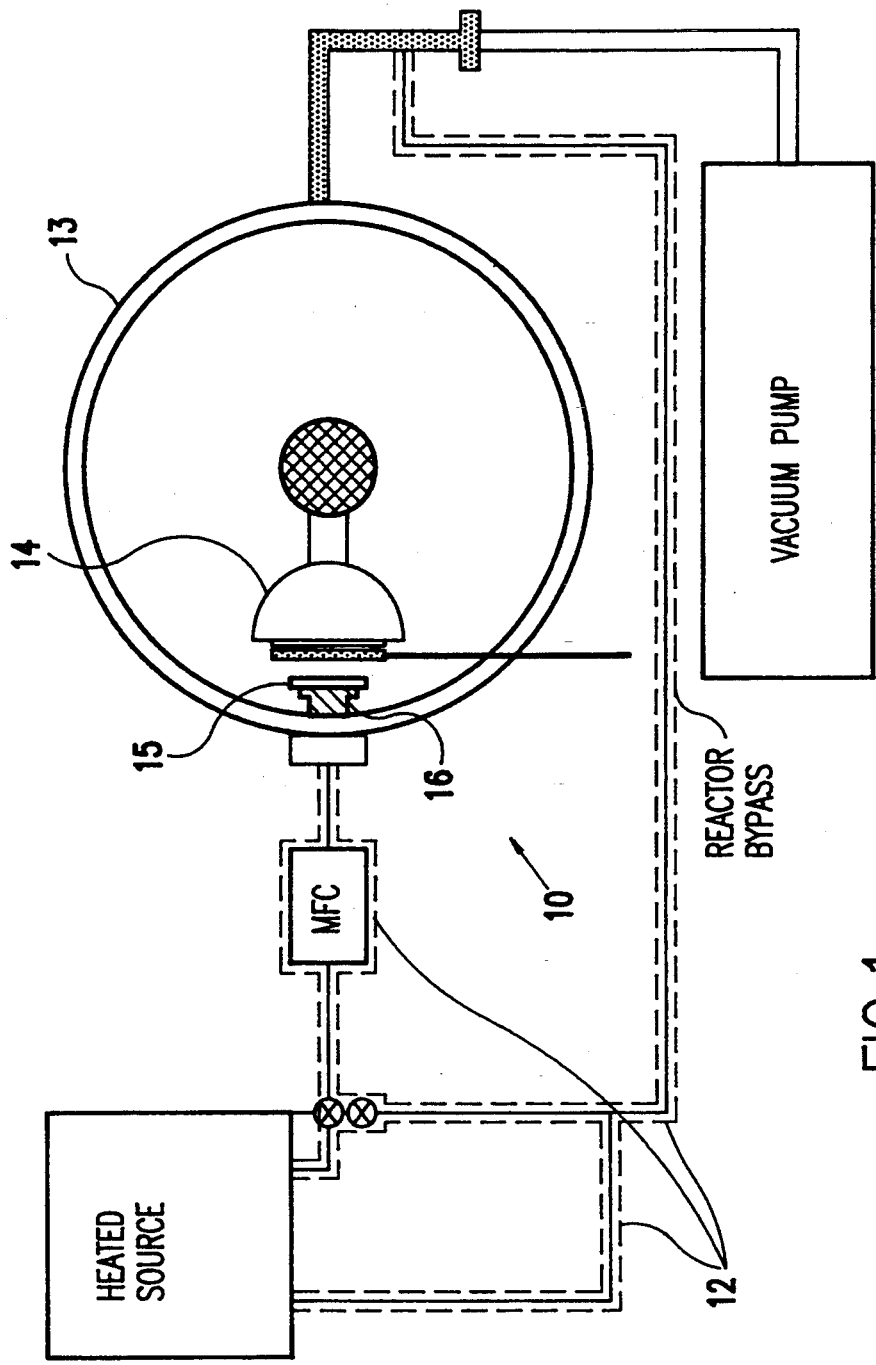
FIG. 1 is a schematic view of a process chamber showing the relative location of the injectors and the flow distribution baffle.

Referring now to the drawings, and more particularly to FIG. 1, there is shown a schematic diagram of a process chamber 10. The current procedure for cleaning the nozzles is to cool the hot wall process chamber 13 and the source delivery system 12 and shut off the heat to the chuck 14. Once the system is cold enough to safely work on, the flow distribution baffle 15 and the face of the injector 16 are manually scrubbed with an abrasive material, and efforts are made to clear the hydroxide of Aluminum deposits in the flow passages of the injector. There is no guarantee, however, that the injector passages have been adequately cleaned due to the complex drilling patterns that cannot be seen visually with a fixed non-removable injector installed.

Figure 3:
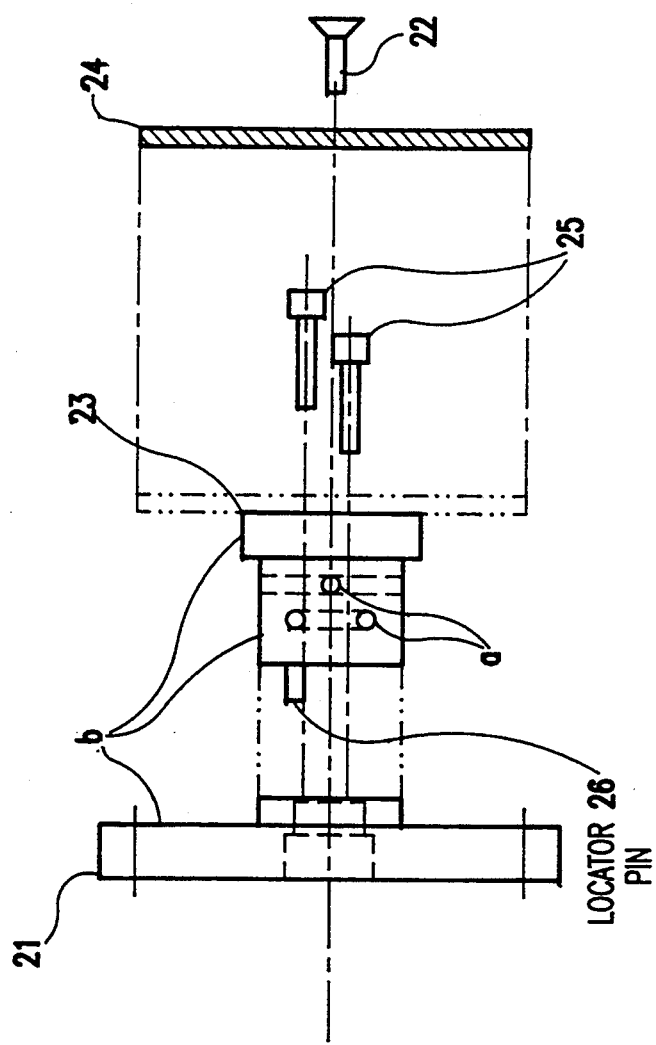
FIG. 3 is a side exploded view of the removable injector nozzle showing the base unit, the removable nozzle and the flow distribution baffle according to the present invention.
Figure 2:
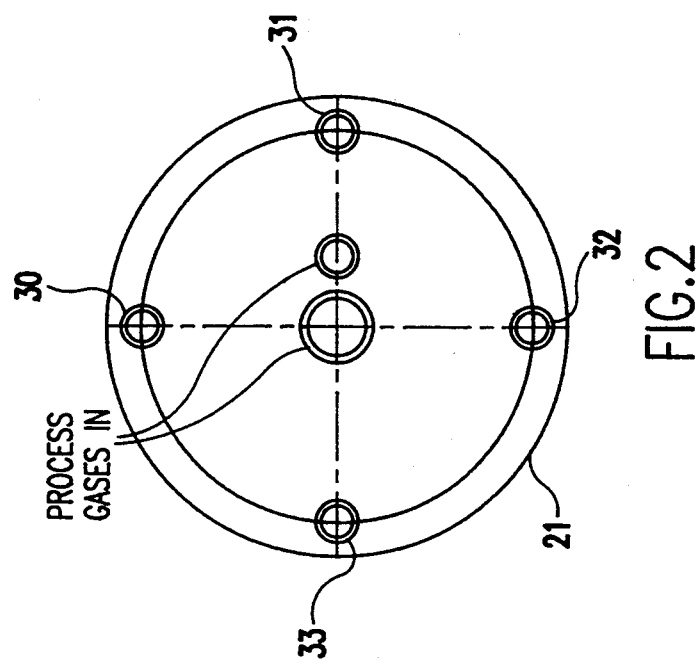
FIG. 2 is a plan view of the base unit of the removable injector nozzle according to the invention.

The present invention changes the design of the injector assembly to separate it into two distinct units plus the distribution baffle. One unit, which is shown in plan view in FIG. 2 and side view in FIG. 3, is the injector base 21 that remains attached to the hot wall process chamber 13 by screws 30, 31, 32 and 33. The other unit, shown in FIG. 3, is a removable nozzle 23 that can be quickly removed and replaced with a clean nozzle. The injector base unit 21 has axial passages for passing reactant gases from outside chamber wall. The removable nozzle unit 23 has axial passages aligned with the axial passages of the injector base and a cross drilled hole pattern a intercepting the axial passages for passing reactant gases into the reactor chamber. A distribution baffle 24 is mounted to the end of the removable nozzle unit 23 with a screw 22.

To remove the nozzle 23, the flow distribution baffle 24 is removed, the two nozzle mounting screws 25 are removed, and the nozzle is simply lifted off. Installation is equally as simple as the nozzle 23 is placed back into position, the two mounting screws 25 are installed, and the flow distribution baffle 24 is reattached with its screw 22. A locator pin 26 in the base of the removable nozzle unit 23 mates with a hole in the face of the base unit 21 to insure correct orientation of the nozzle 23. The base unit 21 provides a leaktight seal to the nozzle 23 when the screws 25 are tightened.

The contaminated nozzle can then be cleaned off line by wet etch, abrasive scrubbing or both, inspected, and readied for installation when required. The nozzle assembly, including the baffle, can be replaced with a new assembly while the original unit is being cleaned to reduce down time.

The baffle 24, when in place, seals the axial passages in the removable nozzle unit 23 and cooperates with the cross drilled hole pattern a to distribute the reactants with an equal flux into the mixing region of the reaction chamber. However, when the distribution baffle 24 is removed and the injector nozzle 23 is also removed, the axial passages and the cross drilled hole pattern a are easily accessible for cleaning. With a removable injector, the problem of internally plugged or partially plugged nozzle passages is eliminated as a known clean nozzle is installed onto the fixed base 21. This provides better reliability, more reproducible film properties, film quality, and film uniformity to the system due to the known condition of the nozzle after cleaning. This eliminates the potential for a consecutive cleaning operation of a fixed nozzle due to contaminated nozzle flow passages. Additionally, the time off line for the cleaning process can be shortened since the time required to remove and replace a nozzle is substantially shorter than the time required to manually scrub a fixed nozzle.

There is another advantage to the easily removable nozzle and baffle plate. Being able to easily remove these components reduces the process development time and reactor optimization time. A large number of different nozzle assemblies (with different hole diameters and hole positions) and baffle plates (of different size and different hole configurations) can be tested quickly to optimize the reactor for a given deposition process.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent are as follows:

1. A gas injector for use in chemical vapor deposition reactors that allows proper mixing of reactant gases comprising:
   an injector base fixed to a chemical vapor deposition chamber wall, said injector base having a plurality of axial passages for passing separate reactant gases from outside said chamber wall;
   a removable nozzle removably attached to said injector base, said removable nozzle having axial passages communicating with the axial passages of said injector base and a cross drilled hole pattern intercepting said axial passages for passing reactant gases into the reactor; and
   attachment means for aligning and removably attaching said nozzle to said injector base to form a gaseous leaktight seal between said nozzle and said base.

2. A gas injector as recited in claim 1 further comprising a baffle removably attached to an end of said removable nozzle projecting away from said injector base, said baffle sealing the axial passages in the removable nozzle and cooperating with the cross drilled hole pattern to distribute reactants with an equal flux into a mixing region of the reactor.

3. A gas injector as recited in claim 1 wherein said attachment means includes a locator pin for aligning said removable nozzle with said injector base and screws removably attaching said removable nozzle to said injector base.

4. A gas injector for use in chemical vapor deposition reactors comprising:
- an injector base attached to a wall of a reaction chamber;
- a removable nozzle to provide a gaseous leaktight seal to the injector base, said removable nozzle having a cross-drilled hole pattern that separately distributes a plurality of reactant gases to provide an equal flux into a mixing region of the reaction chamber of gases;
- a locator pin attached to said removable nozzle to insure correct alignment of said removable nozzle with said injector base; and
- a flow distribution baffle removably attached to said removable nozzle.

5. A gas injector as recited in claim 4 wherein said injector base has axial passages for passing reactant gases from outside said chamber wall, said removable nozzle has axial passages communicating with the axial passages of said injector base, and said flow distribution baffle seals the axial passages in the removable nozzle and cooperates with the cross drilled hole pattern to distribute the reactants with an equal flux into the mixing region of the reactor.

6. A chemical vapor deposition reactor having gas injector that allows proper mixing of reactant gases within a reaction chamber of said reactor, said gas injector comprising:
- an injector base fixed to a chemical vapor deposition chamber wall, said injector base having a plurality of axial passages for passing separate reactant gases from outside said chamber wall;
- a removable nozzle removably attached to said injector base, said removable nozzle having axial passages communicating with the axial passages of said injector base and a cross drilled hole pattern intercepting said axial passages for passing reactant gases into the reactor;
- first attachment means for aligning and removably attaching said nozzle to said injector base to form a gaseous leaktight seal between said nozzle and said base;
- a flow distribution baffle removably attached to an end of said removable nozzle projecting within said reaction chamber, said flow distribution baffle sealing the axial passages in the removable nozzle and cooperating with the cross drilled hole pattern to distribute reactants with an equal flux into a mixing region of the reaction chamber.

* * * * *

UNITED STATES PATENT AND TRADEMARK OFFICE
CERTIFICATE OF CORRECTION

PATENT NO. : 5,425,810
DATED : June 20, 1995
INVENTOR(S) : Richard A. Conti, David E. Kotecki, Donald L. Wilson, Justin W. Wong and Steven P. Zuhoski It is certified that error appears in the above-indentified patent and that said Letters Patent is hereby corrected as shown below:

On the title page item [54] should read

-- REMOVABLE GAS INJECTORS FOR USE IN CHEMICAL VAPOR DEPOSITION OF ALUMINUM OXIDE --

Signed and Sealed this

Third Day of October, 1995

Attest:

BRUCE LEHMAN

*Attesting Officer*   *Commissioner of Patents and Trademarks*